United States Patent
Shibasaki

(10) Patent No.: US 6,599,581 B2
(45) Date of Patent: Jul. 29, 2003

(54) METHOD OF FABRICATING JIG FOR VACUUM APPARATUS

(75) Inventor: Masao Shibasaki, Suwa (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 10/050,913

(22) Filed: Jan. 22, 2002

(65) Prior Publication Data

US 2002/0100423 A1 Aug. 1, 2002

(30) Foreign Application Priority Data

Jan. 26, 2001 (JP) .......................................... 2001-019038

(51) Int. Cl.[7] .................................................. C23C 4/04
(52) U.S. Cl. .................. 427/454; 427/419.2; 427/419.7
(58) Field of Search .................................. 427/455, 456, 427/248.1, 419.2, 419.7, 454, 576, 569; 118/726, 728

(56) References Cited

U.S. PATENT DOCUMENTS

| 5,482,612 A | * | 1/1996 | Armstrong et al. .... 204/298.11 |
| 5,909,354 A | * | 6/1999 | Harada et al. .............. 361/234 |
| 6,235,146 B1 | * | 5/2001 | Kadotani et al. ....... 156/345.52 |

FOREIGN PATENT DOCUMENTS

WO    98/55666    * 10/1998

* cited by examiner

*Primary Examiner*—Katherine A. Bareford
(74) *Attorney, Agent, or Firm*—Oliff & Berridge, PLC

(57) ABSTRACT

A base member is blasted to roughen the surface. Next, a thermal spray member containing for example Al is formed on the blast treated surface of the base member by a thermal spraying. Next, an extremely thin oxide film at an atom layer level is coated on the surface of the thermal spray member, as an uppermost surface. The oxide film is a layer that is formed from stacked layers of about 15 to 23 atoms, and is formed by an $O_2$ or $O_3$ gas plasma, an atmospheric pressure plasma, or a CVD (chemical vapor deposition) method. A nitride film can be coated instead of the oxide film.

5 Claims, 3 Drawing Sheets

METHOD OF FABRICATING JIG FOR VACUUM APPARATUS

Japanese Patent Application No. 2001-19038, filed Jan. 26, 2001, from which this application claims priority, is hereby incorporated by reference in its entirety.

BACKGROUND OF THE INVENTION

The present invention relates to manufacture of a semiconductor device, and more particularly to a method of fabricating a jig for a vacuum apparatus, which is applied to prevent adhesion of deposits on interior walls of a vacuum chamber of a thin film forming apparatus.

A thin film forming process is known as one of LSI manufacturing processes (wafer processes). The thin film forming process may include a film forming method conducted by a physical vapor deposition (PVD) method such as vacuum vapor deposition and sputter vapor deposition, and a vapor phase growth technique, for example a chemical vapor deposition (CVD) method.

These thin film-forming processes are accomplished in a film growth chamber, or a vacuum chamber. When film-forming processes are repeated in a vacuum chamber, residual materials that are not exhausted may accumulate. The residual materials cause particle contamination through adhering as deposits to or peeling from an internal wall of the chamber or areas around peripheral apparatuses such as wafer stages. As a countermeasure, vacuum apparatus jigs for preventing deposits are disposed in areas of importance within the chamber, and jigs on which deposits have accumulated are replaced every fixed period with clean jigs (recycled products). By this procedure, particle generation during film growth is suppressed.

As the vacuum apparatus jigs described above, recycled products, in which metal plates such as stainless steel plates are subject to wet washing to smooth out their surfaces or to blast (horning) washing to roughen their surfaces, are conventionally used. However, the former has a flat surface and therefore has a problem that cohesive strength of deposits is weak. The latter provides great cohesive strength of deposits, but may cause particle contamination on the surfaces of their own that have been blast-treated.

In recent years, techniques such as increasing the surface area of the vacuum apparatus jig by thermal spraying are employed to improve cohesive strength of deposits. More particularly, Ti, Al or the like is thermally sprayed on surfaces of metal plates such as stainless steel plates to form jig surfaces having large surface areas to which deposits can readily adhere. However, during the film forming process, re-peeling of the thermal spray material or gas discharge therefrom takes place more than a little, which causes particle contamination and lowered vacuum level within the vacuum chamber.

BRIEF SUMMARY OF THE INVENTION

The present invention has been made in view of the circumstances described above, and the present invention may provide a method of fabricating a highly reliable jig for a vacuum apparatus, which suppresses generation of particles and deterioration of the vacuum level within a vacuum chamber.

According to one aspect of the present invention, there is provided a method of fabricating a jig for a vacuum apparatus, which is provided in a vacuum chamber for conducting a film forming process to prevent deposits from adhering to the vacuum chamber, the method comprising:

a step of blasting on a base member, a step of thermally spraying a thermal spray member on the base member, and a step of covering a surface of the thermal spray member with an oxide film or a nitride film as an uppermost surface.

In this manner, an extremely thin oxide film or nitride film is formed as the uppermost surface, which contributes to prevention of re-peeling of thermal spray material of the thermal spray member and prevention of gas discharge. Furthermore, deposits can be removed at the same time when the oxide film or the nitride film formed as the uppermost surface is removed.

In this method, the oxide film or the nitride film may be a thin film of an atom layer level.

According to another aspect of the present invention, there is provided a method of fabricating a jig for a vacuum apparatus, which is provided in a vacuum chamber for conducting a film forming process to prevent deposits from adhering to the vacuum chamber, the method comprising:

a step of blasting a base member, a step of coating the base member with an intermediate layer, a step of thermally spraying a thermal spray member on the intermediate layer, and a step of covering a surface of the thermal spray member with an oxide film or nitride film as an uppermost surface, wherein the intermediate layer adsorbs a discharging gas component contained in the thermal spray member.

In this manner, an extremely thin oxide film or nitride film at a level of an atom layer is formed as the uppermost surface, which contributes to prevention of re-peeling of thermal spray material of the thermal spray member and prevention of gas discharge. The interposed intermediate layer adsorbs a discharging gas component, such as moisture, contained in the thermal spray member. Furthermore, deposits can be removed at the same time when the oxide film or the nitride film formed as the uppermost surface is removed.

In this method, the intermediate layer may contain zirconium or titanium as a main component.

In this method, the oxide film or the nitride film may be a thin film of an atom layer level.

DETAILED DESCRIPTION OF THE EMBODIMENT

Figure 1A:
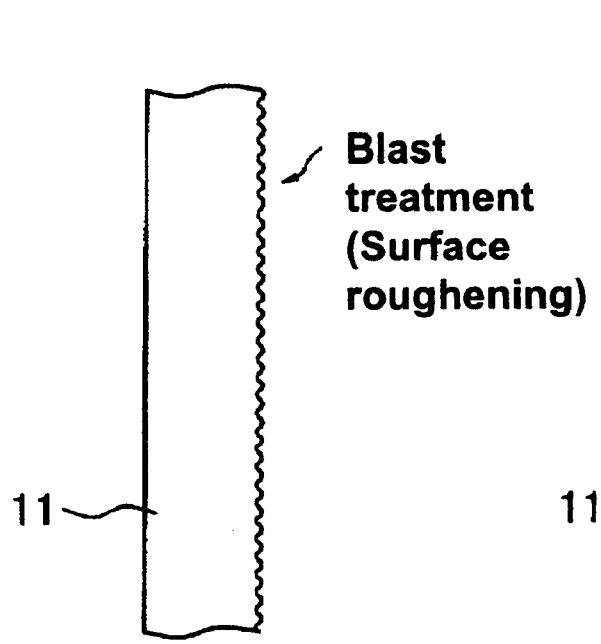
FIGS. 1A through 1C show cross sections in process order in a method of fabricating a jig for a vacuum apparatus in accordance with a first embodiment of the present invention.
Figure 1B:
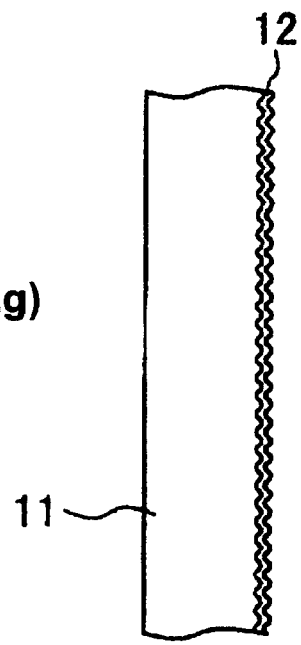
Figure 1C:
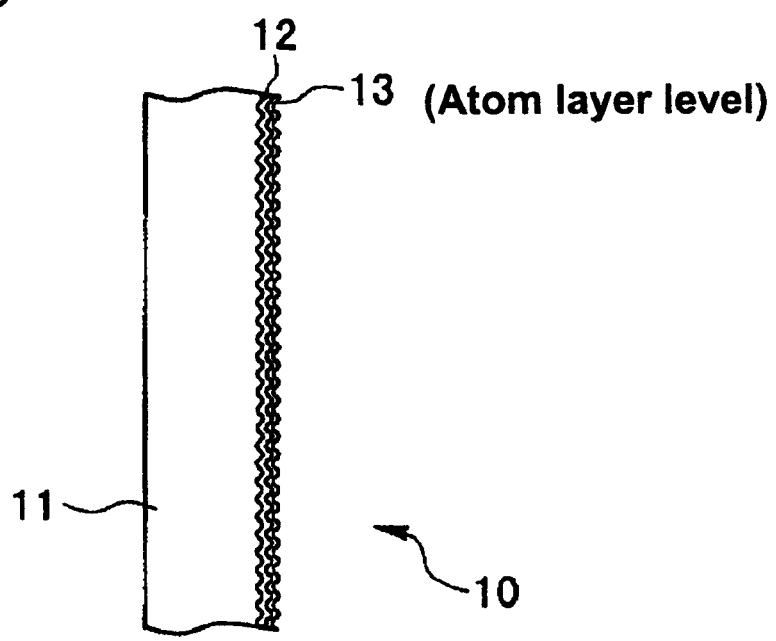

FIGS. 1A through 1C show cross sections in process order in a method of fabricating a jig for a vacuum apparatus in accordance with a first embodiment of the present invention. A vacuum apparatus jig 10 relates to a thin film forming process in a process for manufacturing a semiconductor device, and is disposed in an area of importance within a vacuum chamber which is a film forming chamber, to prevent deposits from accumulating on internal walls of the chamber or areas around peripheral apparatuses of a wafer stage.

First, as shown in FIG. 1A, a base member 11 in a specified configuration that is made from, for example, stainless steel is blasted to roughen the surface. Next, as shown in FIG. 1B, a thermal spray member 12 containing for example Aluminum (Al) is formed to a thickness of about 10 to 20 μm on the blast treated surface of the base member 11 by thermally spraying particles thereof in particle diameters of about 5 to 10 μm. The thermal spray can be achieved by spraying with a thermal spray gun, or spraying a thermal spray member within a gas plasma atmosphere. A thermal spray member 12 containing Ti, instead of Al, as a main component may be thermally sprayed.

Next, as shown in FIG. 1C, an extremely thin oxide film 13 at a level of an atom layer is coated on the surface of the thermal spray member 12, as an uppermost surface. The oxide film 13 is a layer that is formed from stacked layers of about 15 to 23 atoms, and is formed by an $O_2$ or $O_3$ gas plasma, an atmospheric pressure plasma, or a CVD method. The film thickness is set at an atom layer level because there is a concern that a thick film may affect the atmosphere within the chamber. A nitride film can be coated instead of the oxide film 13.

In accordance with the method of the present embodiment, the surface area of the jig can be increased by the stacked layers formed according to the blast treated surface. Also, since the surface is formed from curved surfaces, good cohesive strength of deposits can be maintained. Also, the extremely thin oxide layer 13 (or nitride layer) at an atom layer level formed as an uppermost surface contributes to prevention of re-peeling of the thermal spray material from the thermal spray member 12 or prevention of gas discharge therefrom. As a result, particles within the vacuum chamber are reduced, and the time required to achieve a specified vacuum level can be shortened.

Furthermore, deposits adhered to the vacuum apparatus jig 10 can be removed by only removing the oxide film 13 at the uppermost surface (i.e., through a lift-off etching). As a result, recycling of the jig is substantially facilitated, and the cost can be reduced.

FIGS. 2A through 2D show cross sections in process order in a method of fabricating a jig for a vacuum apparatus in accordance with a second embodiment of the present invention. A vacuum apparatus jig 20 pertains to a thin film forming process in a process for manufacturing a semiconductor device, and is disposed in an area of importance within a vacuum chamber which is a film forming chamber, to prevent deposits from accumulating on an internal wall of the chamber or areas around a peripheral apparatus such as a wafer stage.

Figure 2A:
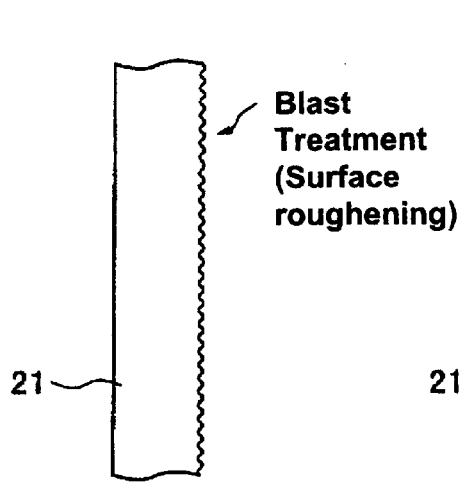
FIGS. 2A through 2D show cross sections in process order in a method of fabricating a jig for a vacuum apparatus in accordance with a second embodiment of the present invention.
Figure 2B:
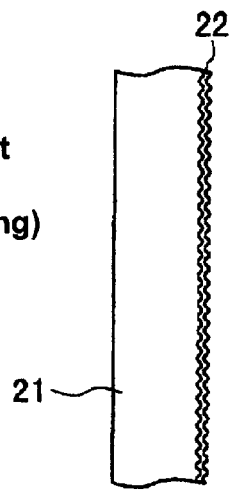

First, as shown in FIG. 2A, a base member 21 in a specified configuration that is made from, for example, stainless steel is blasted to roughen the surface. Next, as shown in FIG. 2B, an intermediate layer 22 containing for example Zr as a main component is coated on the blast treated surface of the base member 21 to a specified thickness. The intermediate layer 22 is coated by a plating method (electrolytic plating, non-electrolytic plating) or a CVD method. An intermediate layer 22 containing Ti as a main component instead of Zr may be formed.

Figure 2C:
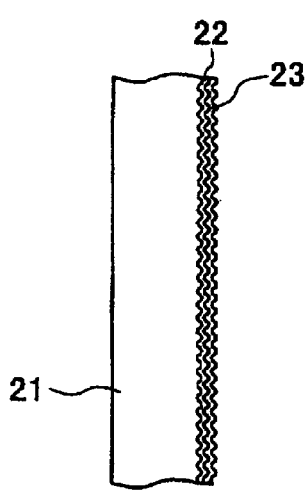

Next, as shown in FIG. 2C, a thermal spray member 23 containing for example Al as a main component is formed to a thickness of about 10 to 20 μm on the intermediate layer 22 by thermally spraying particles thereof in particle diameters of about 5 to 10 μm. The thermal spray can be achieved by spraying with a thermal spray gun, or spraying a thermal spray member within a gas plasma atmosphere. A thermal spray member 23 containing Ti as a main component instead of Al can be thermally sprayed.

Figure 2D:
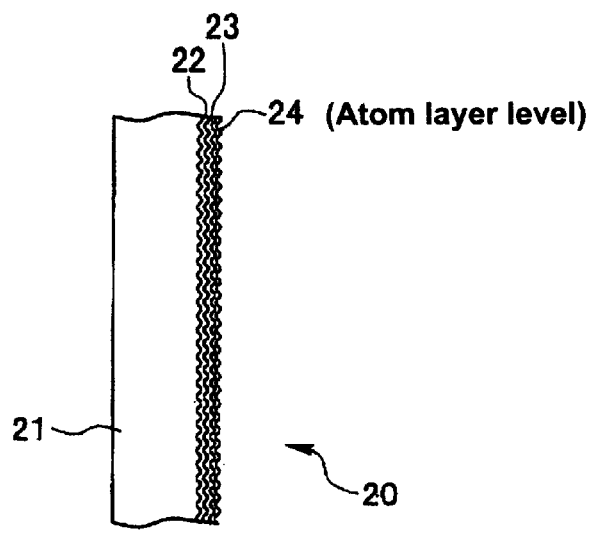

Next, as shown in FIG. 2D, an extremely thin oxide film 24 at an atom layer level is coated on the surface of the thermal spray member 23, as an uppermost surface. The oxide film 24 is a layer that is formed from stacked layers of about 15 to 23 atoms, and is formed by an $O_2$ or $O_3$ gas plasma, an atmospheric pressure plasma, or a CVD method. The film thickness is set at an atom layer level because there is a concern that a thick film may affect the atmosphere within the chamber. A nitride film can be coated instead of the oxide film 24.

In accordance with the method of the present embodiment, the surface area of the jig can be increased by the stacked layers formed according to the blast treated surface. Also, since the surface is formed from curved surfaces, good cohesive strength of deposits can be maintained.

Also, the extremely thin oxide layer 24 (or nitride layer) at an atom layer level formed as an uppermost surface contributes to prevention of re-peeling of the thermal spray material from the thermal spray member 23 or gas discharge therefrom. Furthermore, the interposed intermediate layer 22 containing zirconium or titanium as a main component adsorbs a discharging gas component, such as moisture, contained in the thermal spray member 23. As a result, particles within the vacuum chamber are reduced, and the time required to achieve a specified vacuum level can be shortened.

Furthermore, deposits adhered to the vacuum apparatus jig can be removed by only removing the oxide film 24 at the uppermost surface (i.e., through a lift-off etching). As a result, recycling of the jig is substantially facilitated, and the cost can be reduced.

Figure 3:
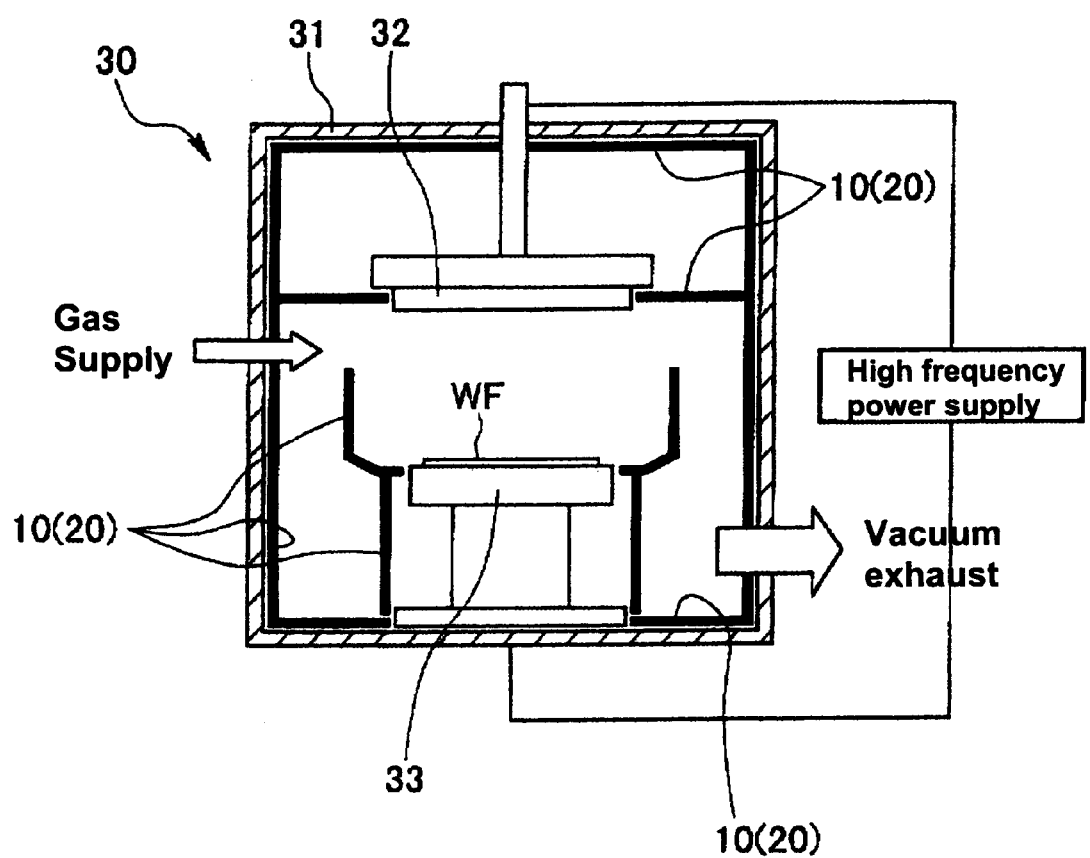
FIG. 3 shows a structure of an example in which the vacuum apparatus jigs according to the first or the second embodiment are disposed in a sputtering apparatus.

FIG. 3 shows a structure of an example in which vacuum apparatus jigs (10 or 20) according to the first or the second embodiment are disposed in a sputtering apparatus. As puttering apparatus 30 is a type in which a target 32 and a semiconductor wafer WF are disposed up and down and opposite to one another in a vacuum chamber 31. The vacuum apparatus jigs 10 (or 20) are disposed in areas of importance within the vacuum chamber 31 for preventing adhesions on internal surfaces within the chamber. In other words, the vacuum apparatus jigs 10 (or 20) are disposed in areas around the target 32 and the wafer WF which are disposed opposite to each other, areas around a wafer stage (including an elevator mechanism) 33, on internal wall surfaces within the vacuum chamber 31 and the like. The vacuum apparatus jigs 10 (or 20) are replaced with clean jigs (recycled products) at predetermined intervals during which deposits accumulate.

It is noted that, in the embodiments described above, an example in which the base member for the vacuum apparatus jig 10 or 20 is formed from stainless steel is shown. However, without being limited to these embodiments, a base member containing Al as a main component, a base member containing Ti as a main component or the like can also be used.

As described above, an extremely thin oxide film or nitride film at an atom layer level is formed as an uppermost surface, which contributes to prevention of re-peeling of thermal spray material of the thermal spray member and prevention of gas discharge therefrom. Furthermore, deposits can be removed at the same time when the oxide film or the nitride film formed as the uppermost surface is removed (i.e., through a lift-off etching). As a result, a method of fabricating a highly reliable jig for a vacuum apparatus, which suppresses generation of particles and deterioration of the vacuum level within a vacuum chamber can be provided.

What is claimed is:

1. A method of fabricating a jig for a vacuum apparatus, which is provided in a vacuum chamber for forming a film on a wafer located on a wafer stage, said wafer stage being separate from the jig, to prevent deposits from adhering to the vacuum chamber, the method comprising:

blasting on a base member to roughen the surface, thermally spraying a thermal spray layer on the base member, and covering a surface of the thermal spray layer with an oxide film or a nitride film as an uppermost surface.

2. The method as defined in claim 1, wherein the oxide film or the nitride film is a thin film of an atom layer level.

3. A method of fabricating a jig for a vacuum apparatus, which is provided in a vacuum chamber for forming a film on a wafer located on a wafer stage, said wafer stage being separate from the jig, to prevent deposits from adhering to the vacuum chamber, the method comprising:

blasting a base member to roughen the surface, coating the base member with an intermediate layer, thermally spraying a thermal spray layer on the intermediate layer, and covering a surface of the thermal spray layer with an oxide film or nitride film as an uppermost surface, wherein the intermediate layer adsorbs a discharging gas component contained in the thermal spray layer.

4. The method as defined in claim 3, wherein the intermediate layer contains zirconium or titanium as a main component.

5. The method as defined in claim 3, wherein the oxide film or the nitride film is a thin film of an atom layer level.

* * * * *